United States Patent
Sweterlitsch

(10) Patent No.: US 6,893,897 B2
(45) Date of Patent: May 17, 2005

(54) STACKED PACKAGE FOR INTEGRATED CIRCUITS

(75) Inventor: Jennifer R. Sweterlitsch, Vestal, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/768,794

(22) Filed: Jan. 29, 2004

(65) Prior Publication Data

US 2004/0183181 A1 Sep. 23, 2004

Related U.S. Application Data

(62) Division of application No. 10/241,995, filed on Sep. 11, 2002, now Pat. No. 6,737,742.

(51) Int. Cl.[7] .................. H01L 21/44; H01L 21/48; H01L 21/50
(52) U.S. Cl. .................. 438/107; 438/106; 438/110
(58) Field of Search ................. 438/106–110; 257/686–687, 723–724, 737–738

(56) References Cited

U.S. PATENT DOCUMENTS

| | | | |
|---|---|---|---|
| 5,763,939 A | * | 6/1998 | Yamashita .................. 257/668 |
| 5,899,705 A | | 5/1999 | Akram |
| 6,166,443 A | | 12/2000 | Inaba et al. |
| 6,201,266 B1 | | 3/2001 | Ohuchi et al. |
| 6,339,254 B1 | | 1/2002 | Venkateshwaran et al. |
| 6,340,846 B1 | | 1/2002 | LoBianco et al. |
| 6,351,194 B2 | * | 2/2002 | Takahashi et al. .......... 257/712 |

* cited by examiner

*Primary Examiner*—Cuong Nguyen
(74) *Attorney, Agent, or Firm*—William H. Steinberg

(57) ABSTRACT

A space-saving integrated circuit package employs two printed circuit boards joined together, the upper board having an integrated circuit attached by flip-chip technology and the lower board having a cavity for holding an integrated circuit that is located beneath the upper integrated circuit, the lower integrated circuit being bonded to the bottom of the upper board below the upper integrated circuit and electrically connected to wiring on the lower surface of the lower board by wire bond connections.

2 Claims, 1 Drawing Sheet

STACKED PACKAGE FOR INTEGRATED CIRCUITS

CROSS REFERENCE TO COPENDING APPLICATION

This application is a divisional application of Ser. No. 10/241,995, filed Sep. 11, 2002 now U.S. Pat. No. 6,737,742.

TECHNICAL FIELD

The field of the invention is that of packaging integrated circuits.

BACKGROUND OF THE INVENTION

In the field of packaging integrated circuits, there is a constant drive to make the packaging more compact, so that more chips per unit of area can be fitted within a given volume.

Various schemes to stack chips vertically have been proposed, but that suffer from various drawbacks. In the particular case of ball grid array contacts, which are preferred in many applications because of superior electrical performance, the vertical height of the chips is an issue, since excessive vertical height must be compensated for by large-diameter balls or by expensive alternatives such as putting down spacer layers to build up the height.

Using a cavity in a printed circuit board has the drawback that the cost of forming a cavity can be excessive in a cost-conscious field such as packaging. Special-configuration boards that are manufactured in limited numbers also suffer from an associated high inventory cost.

Passing signals between vertically separated chips also presents a challenge to achieve reliably and economically.

SUMMARY OF THE INVENTION

The invention relates to an integrated circuit package having two parallel printed circuit boards joined together by electrical connections, the upper board having an integrated circuit attached by flip-chip technology on its upper surface and the lower board having an aperture extending through it (cavity) for holding an integrated circuit that is located beneath the upper integrated circuit.

A feature of the invention is the lower integrated circuit being bonded to the bottom of the upper board below the upper integrated circuit and electrically connected to wiring on the lower surface of the lower board by wire bond connections.

Another feature of the invention is the attachment of the two boards by ball grid connectors that also carry electrical signals.

Another feature of the invention is the attachment of the lower surface of the lower board to a support by contacts having a vertical dimension sufficient to provide clearance for the projection of the lower integrated circuit past the lower surface of the lower board.

DETAILED DESCRIPTION

Figure 1:
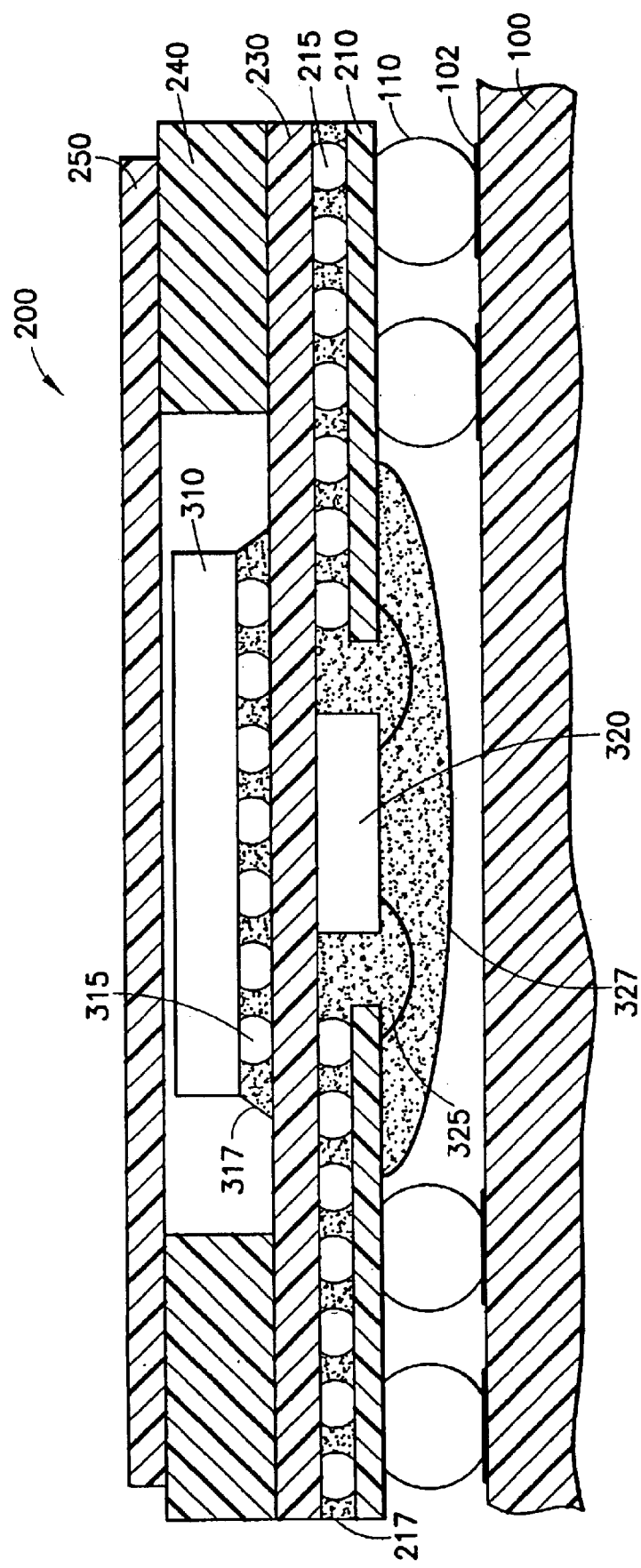
FIG. 1 illustrates in cross section an embodiment of the invention.

Referring now to FIG. 1, there is shown in cross section an embodiment of the invention in which an integrated circuit package, denoted generally by numeral 200, houses two integrated circuits (ICs) 310 and 320. The whole package 200 is connected to the outside world through ball grid array 110, contacting contact pads 102 on substrate 100.

The integrated circuits 310 and 320 are supported and connected by printed circuit boards (pcbs) 210 and 230. Each of boards 210 and 230 may have internal horizontal and vertical connections that are omitted from the drawing for clarity the conductive bonding members 215, Illustratively "C4" solder balls connecting counterpart pads on both surfaces, between the boards carry signals and power and also provide mechanical attachment. There will be various signal paths from the upper integrated circuit 310 through interconnects on board 230 through contacts 215 and then through additional interconnects on board 210 to lower integrated circuit 320. Board 210 is a cavity wire-bond type, having a cavity at the center of the Figure to hold integrated circuit 320. Board 230 is a flip-chip type having a contact array 315 for contacting integrated circuit 310. Illustratively, integrated circuit 310 has flip-chip connections suited for making a large number of input and output (I/O) connections and integrated circuit 320 has a smaller number of connections suited for wire-bond applications.

The arrangement illustrated provides for a short signal path between the two chips, with connections being made through vias and internal wiring layers in board 230, some of which pass through contacts 215, to lower board 210 and then to integrated circuit 320, passing through wire bonds 325.

IC 320 is bonded on the side that is not electrically active (i.e. does not have any electrical contacts) to the lower side of board 230 by thermally conductive glue or solder. No vias carry signals or power through board 230 in this integrated circuit region of board 230 integrated circuit 320. There will, of course, be vias and other interconnections connecting up with contacts 315 to IC 310.

The integrated circuits are enclosed by a combination of methods. On the upper side, a conventional lid 250 is bonded to rim 240 that, in turn is bonded to upper board 230. On the lower side, integrated circuit 320 is encapsulated by epoxy 327, which occupies a small amount of space that does not interface with contacts 110. Since the lower integrated circuit 320 is encapsulated, potential paths for moisture or other contaminants through the contact array 215 are not of concern.

In addition to the benefits of a short signal path between the two integrated circuits, the arrangement illustrated has the benefit that it is inherently modular. The boards 210 and 230 will be fabricated separately and it will be easy to substitute different board—integrated circuit combinations 210 and 320 to suit different purposes of using integrated circuit 310. There will be a pattern of contacts on the lower surface of board 230. A matching pattern will be formed on board 210, to be connected both mechanically and electrically by C4 (or equivalent) connections 215. If desired, dielectric fill 217 can be placed around contact members 215, as fill 317 is placed around contacts 315 on the upper board. Board 210 may be one of a set of boards 210', etc. that have different interconnects adapted to several different lower integrated circuits 320.

As but one example, integrated circuit 310 could be a special purpose integrated circuit to accomplish some purpose, such as manipulating graphic images and integrated circuit 320 could be an adapter integrated circuit to adapt the general purpose integrated circuit 310 to different game players for playing computer games. In that case, different integrated circuits 320 would be made up to conform to the requirements of different manufacturers. The boards 210 to go with the different integrated circuits 320 could differ in connections and/or cavity size to allow for different physical integrated circuits accomplishing such an interface purpose. Those skilled in the art will readily be able to devise many other combinations of flexible integrated circuit systems adapting one chip to different requirements.

Another benefit of the inventive arrangement is that the upper integrated circuit/board combination can be tested independently of the lower integrated circuit/board combination. Since the joining process between the two boards uses interface contacts that are large compared to the dimensions of wires and contacts within integrated circuits, the alignment between the two boards is not sensitive.

Yet another advantage of the inventive arrangement is that the cavity in board 210, plus the thickness allowed for contact array 315 provides for only a small projection of integrated circuit 320 below the lower surface of lower board 210. The integrated circuit projects an offset distance (its thickness plus the thickness of the bonding material) below the lower surface of board 230. The difference between the lower surface of board 210 and of integrated circuit 320 is referred to as the offset difference. That, in turn, means that ball grid contacts 110 can be smaller, saving on clearance space in the vertical dimension and in the amount of material (especially significant if lead-containing solder is used).

While the invention has been described in terms of a single preferred embodiment, those skilled in the art will recognize that the invention can be practiced in various versions within the spirit and scope of the following claims.

What is claimed is:

1. A method of forming a package for integrated circuits comprising the steps of:

forming an upper board having a set of upper contact members adapted for bonding an upper integrated circuit through signal-carrying contacts formed on an upper surface of said upper board in an upper integrated circuit location and a set of electrically conductive bonding members on a lower surface of said upper board, said upper board having a bonding surface on said lower surface thereof below said upper integrated circuit location;

forming a lower board having a counterpart set of electrically conductive bonding members on an upper surface of said upper board matching said set of electrically conductive bonding members on said lower surface of said upper board and having an aperture passing therethrough below said bonding surface, thereby forming a cavity adapted for holding a lower integrated circuit and a set of wirebond pads disposed about said aperture on a lower surface of said lower board for contacting said second integrated circuit; and bonding said upper board to said lower board with said set of electrically conductive bonding members.

2. A method of forming a package for integrated circuits according to claim 1, further comprising the steps of:

bonding an upper integrated circuit to said upper board and testing the combination of said upper integrated circuit and said upper board;

bonding a lower integrated circuit to said lower board and testing the combination of said lower integrated circuit and said lower board; and thereafter bonding said upper board to said lower board.

* * * * *